United States Patent
Sun et al.

(10) Patent No.: US 6,998,343 B1
(45) Date of Patent: Feb. 14, 2006

(54) METHOD FOR CREATING BARRIER LAYERS FOR COPPER DIFFUSION

(75) Inventors: Grace Sun, Mountain View, CA (US); Vladimir Zubkov, Mountain View, CA (US); William K. Barth, Gresham, OR (US); Sethuraman Lakshminarayanan, San Jose, CA (US); Sey-Shing Sun, Portland, OR (US); Agajan Suvkhanov, Portland, OR (US); Hao Cui, West Linn, OR (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/721,971

(22) Filed: Nov. 24, 2003

(51) Int. Cl.
*H01L 21/44* (2006.01)

(52) U.S. Cl. .............. 438/659; 438/643; 438/653; 438/677; 257/762

(58) Field of Classification Search .......... 438/687, 438/677, 675, 672, 659, 658, 618, 652–654, 438/642–644, 626–629, 622, 623, 624, 631, 438/633, 635, 637, 639; 257/758, 762
See application file for complete search history.

(56) References Cited

U.S. PATENT DOCUMENTS

| | | | |
|---|---|---|---|
| 3,632,438 A | 1/1972 | Carlson et al. | |
| 3,710,205 A | 1/1973 | Swanson | |
| 4,352,716 A | 10/1982 | Schaible et al. | |
| 6,057,223 A | 5/2000 | Lanford et al. | |
| 6,077,775 A | 6/2000 | Stumborg et al. | |
| 6,083,794 A * | 7/2000 | Hook et al. | 438/286 |
| 6,083,818 A | 7/2000 | Stumborg et al. | |
| 6,117,770 A | 9/2000 | Pramanick et al. | |
| 6,211,066 B1 | 4/2001 | Stumborg et al. | |
| 6,226,173 B1 | 5/2001 | Welsch et al. | |
| 6,261,963 B1 | 7/2001 | Zhao et al. | |
| 6,355,555 B1 | 3/2002 | Park | |
| 6,441,492 B1 | 8/2002 | Cunningham | |
| 6,566,247 B1 | 5/2003 | Stumborg et al. | |
| 6,633,085 B1 * | 10/2003 | Besser et al. | 257/774 |
| 6,703,307 B1 * | 3/2004 | Lopatin et al. | 438/653 |
| 6,703,308 B1 * | 3/2004 | Besser et al. | 438/659 |
| 2002/0076925 A1 | 6/2002 | Marieb et al. | |

FOREIGN PATENT DOCUMENTS

JP 63290559 A * 11/1988

* cited by examiner

*Primary Examiner*—Tom Thomas
*Assistant Examiner*—N. Drew Richards
(74) *Attorney, Agent, or Firm*—Beyer Weaver & Thomas, LLP

(57) ABSTRACT

A method for forming damascene interconnect copper diffusion barrier layers includes implanting calcium into the sidewalls of the trenches and vias. The calcium implantation into dielectric layers, such as oxides, is used to prevent Cu diffusion into oxide, such as during an annealing process step. The improved barrier layers of the present invention help prevent delamination of the Cu from the dielectric.

17 Claims, 5 Drawing Sheets

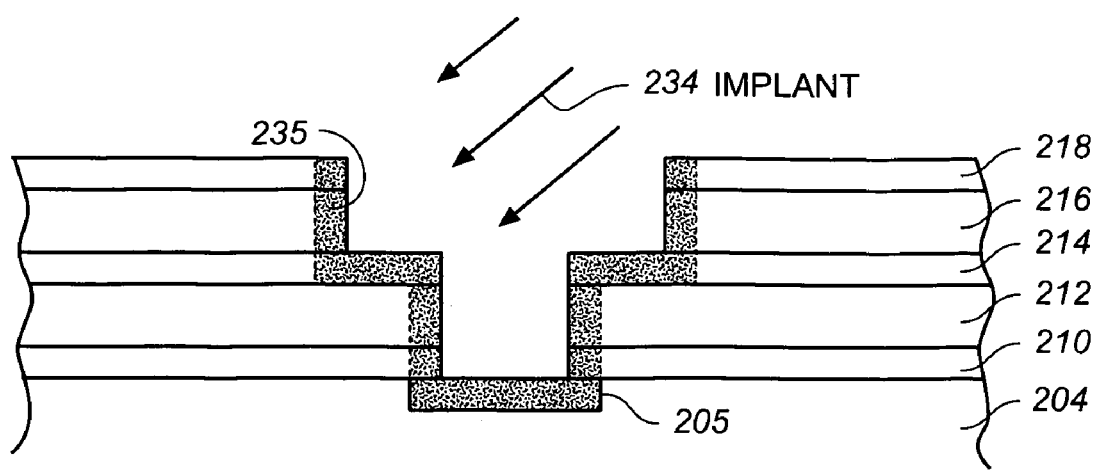
FIG._2F'

METHOD FOR CREATING BARRIER LAYERS FOR COPPER DIFFUSION

BACKGROUND OF THE INVENTION

1. Field of the Invention

The present invention relates to the formation of metal interconnects on semiconductor wafers. More particularly, the present invention relates to the formation of barrier layers to prevent diffusion of copper.

2. Description of the Related Art

As integrated circuit devices grow smaller and smaller, higher conductance and lower capacitance is required of the interconnects. That is, as integrated circuits become smaller, it becomes more desirable to reduce interconnection delays through the selection of materials used in the interconnects and associated dielectric layers. The propagation delays through the interconnects are proportional to the resistance of the interconnects and the capacitance offered by the dielectric. In fact, as integrated devices become smaller, the resistance capacitance (RC) delay time of signal propagation along interconnects becomes the dominant factor limiting overall chip speed. In order to accommodate these objectives, the trend has been towards the use of copper for interconnects and damascene methods for forming the interconnects.

Copper has gained favor in the industry because of its many advantages, including its low resistance. In such processes, conducting metal (e.g., copper) is inlaid into trench and via structures of insulating material (e.g., low-k dielectric materials). CMP (Chemical Mechanical Polishing) is used to remove conducting metal (e.g., copper) in single or dual damascene processes. One drawback to the use of copper in as the conductive metal in the interconnect lines is its tendency to diffuse (i.e., leakage) into adjacent dielectric layers. Copper diffuses easily into dielectric layers, e.g., silicon dioxide or oxide, and diminishes the electrical insulation qualities of the dielectric.

Copper barrier layers, for example layers containing tantalum, have been deposited before the deposition of copper to prevent "leakage". Barrier layers must be able to prevent diffusion, exhibit low film resistivity, have good adhesion to dielectric and Cu and must also be CMP compatible. Also the layer must be conformal and continuous to fully encapsulate Cu lines with as thin a layer as possible. Due to higher resistivity of barrier material, the thickness should be minimized for Cu to occupy the maximum cross-sectional area.

Current barrier layers may include titanium (Ti), tantalum (Ta), and derivatives of these metals such as nitrides and carbides of these metals. Silicon nitrides and carbides are also being employed as effective barriers. One example of a silicon carbide barrier layer provides a first silicon carbide layer, on which a thick oxide deposition is placed. Another silicon carbide layer is placed over the oxide deposition. Another oxide deposition is placed over the second silicon carbide layer. The silicon carbide acts as a barrier for copper diffusion.

Providing thin barrier layers also avoids increasing the dielectric constant of the oxide. Current methods of forming barrier layers may be too porous or may be difficult to control to provide a thin barrier layer or may not be sufficiently pure.

Accordingly, it is desirable to provide more effective barrier layers that are thin, have a high purity, and low porosity.

SUMMARY OF THE INVENTION

To achieve the foregoing, the present invention provides methods for forming a barrier layer. The present invention provides a method for forming damascene interconnect copper diffusion barrier layers by implanting calcium ions into the sidewalls of the trenches and vias. That is, Ca ion implantation into dielectric layers, such as oxides, is used to prevent Cu diffusion into oxide, such as during an annealing process step. Moreover, the improved barrier layers of the present invention help prevent delamination of the Cu from the dielectric.

According to one embodiment, a method of forming a damascene interconnect barrier layer includes forming a trench in a dielectric and implanting Ca ions into the sidewalls of the trench. The trench includes trenches and vias of dual damascene interconnect structures as well as channels formed in single damascene processes.

According to another embodiment, the method further includes first implanting Ca ions into a thin bottom dielectric layer that in the final configuration defines the bottom of the via in a dual damascene process or the bottom of the trench in a single damascene process. In yet another embodiment, the top of the interconnect is bounded by a thin dielectric layer implanted with Ca ions.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

As discussed above, with increasing miniaturization of integrated circuits, the trend has been towards incorporating copper interconnect metal layers with low-k dielectric layers in forming the interconnect levels for these circuits. These interconnect layers are typically formed by damascene methods. For example, damascene processing involves etching trenches in insulating layers (such as a low-K layer) in a desired pattern for a wiring layer. These trenches are then filled with conductive material to produce the integrated interconnect wires. Where contact vias, extending downwardly from the bottom of the trenches, are simultaneously filled, the process is known as dual damascene. The fill process for the copper interconnects typically includes a diffusion barrier, a copper seed layer, and the deposition of the bulk copper. The copper interconnect lines are formed by polishing away the field copper, the seed layer, and the diffusion barrier down to the underlying dielectric. Conventional barrier etch stops, for example silicon nitride, provide a barrier to copper while providing adequate etch selectivity to oxides for the damascene etching steps. Unfortunately, the k value of silicon nitride is higher than 7.0 and when used in conjunction with low-k dielectrics, adversely impacts the overall k value of the damascene stack. By using the Ca implant barrier techniques of the present invention, the thinner barrier layers lead to higher conductivities of the copper interconnects and lower capacitance of the dielectrics.

Figure 1:
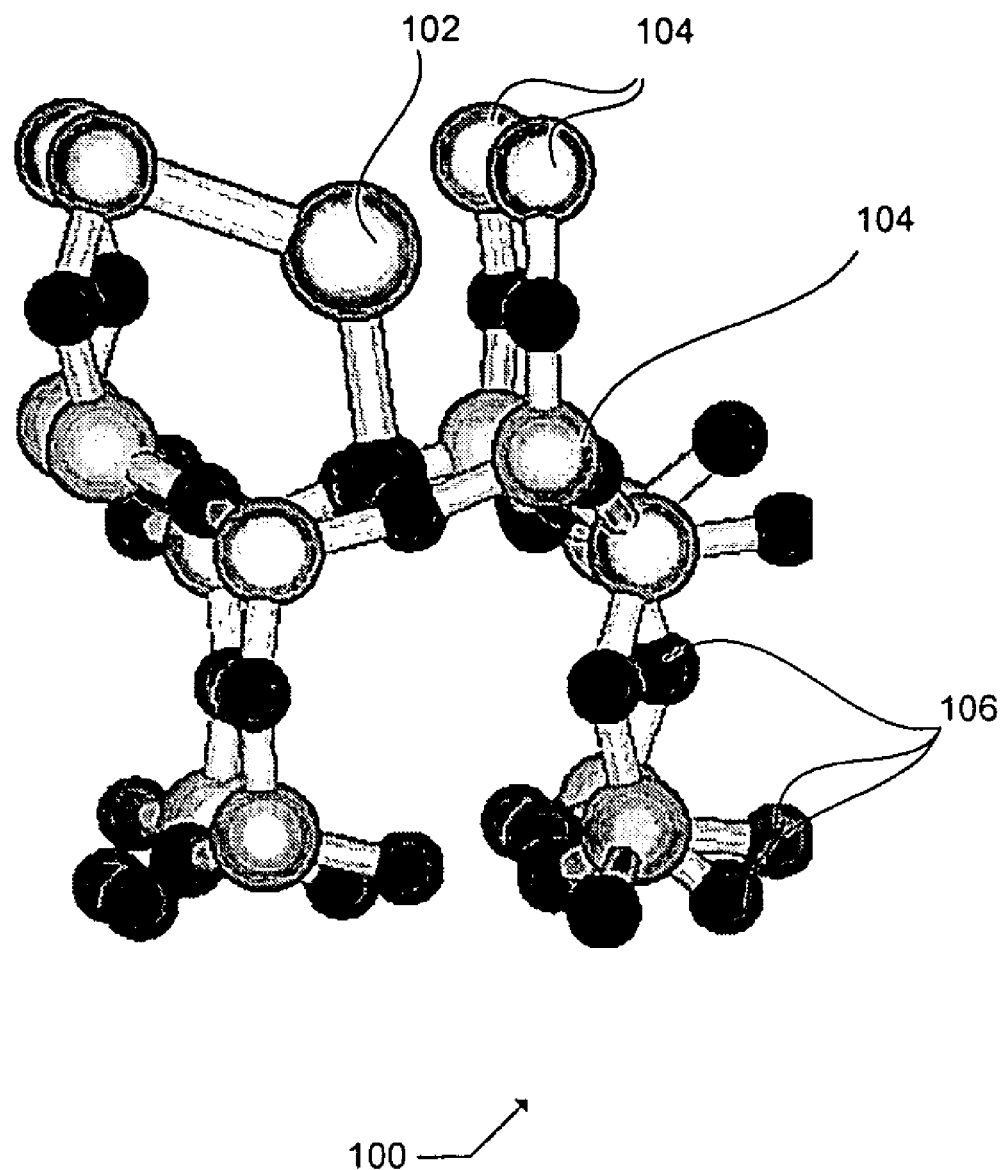
FIG. 1 is a schematic illustration simulating the interaction between calcium and a siloxane ring in accordance with one embodiment of the present invention.

To assess the viability of calcium as a barrier to Cu diffusion, an analysis based on quantum mechanical calculations was performed and showed that interaction of atomic calcium with a siloxane ring leads to insertion of the calcium atom into the ring. Specifically, density functional theory calculations with periodic boundary conditions were performed using the Variable Dimension Automated Synthesis Program (VASP) code. Local density approximations (LDA) used Perdew Wang 91 (PW91) functionals. Ultrasoft pseudopotentials with 395.70 eV energy cutoff in the plane wave expansion and a 2×2×2 k-point sampling were also used in the analysis. In the analysis simulation, the mineral Tridymite was used to represent silicon dioxide and was represented by a cell 100 of 48 atoms as illustrated in FIG. 1. The Ca atom 102 is shown inserted into the siloxane ring, the latter comprising Si atoms 104 and oxygen atoms 106.

An attraction energy of about 5 eV was found between Ca and Cu. This energy is believed to be sufficient to act as a barrier to prevent Cu diffusion in silicon dioxide The analysis supports the conclusion that Ca buried in silicon dioxide forms strong attraction even with neutral Cu.

Figure 2A:
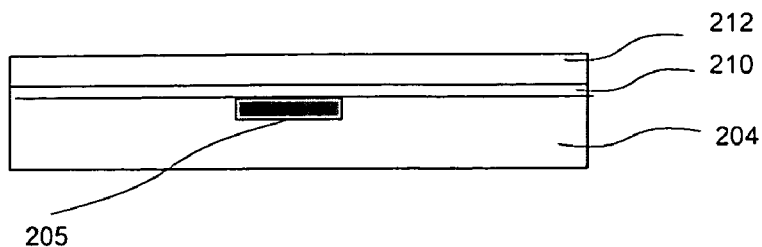
FIGS. 2A–2K are diagrams illustrating stages in a dual damascene process of forming a semiconductor integrated circuit barrier layer in accordance with one embodiment of the present invention.

FIGS. 2A–2K are diagrams illustrating stages in the via-first dual damascene process of forming a semiconductor integrated circuit barrier layer in accordance with one embodiment of the present invention. Embodiments of the present invention eliminate the need for additional process steps to form a separate barrier layer in the opening in the dielectric that defines the trench or on top of the copper interconnects. The process begins, as shown in FIG. 2A, with a barrier layer 210 containing, for example, silicon nitride or silicon carbide, formed over the first metal interconnect 205, the latter formed in a dielectric 204. The metal interconnect 205 is shown for illustrative purposes as an interconnect but may include any conductor in an underlying layer, for example, a contact to a gate (or diffusion area) or a local interconnect. The barrier layer 210 may be formed in accordance with conventional techniques, as known to those of skill in the relevant art. For example, the barrier layer 210 may be formed by plasma enhanced chemical vapor deposition ("PECVD") methods or other methods known to those of skill in the relevant art. Dielectric 204, as illustrated, may be any interlayer dielectric. For example, the dielectric may be a pre-metal dielectric (PMD) or any intermetal dielectric (IMD). Further, dielectric layer 204 may comprise $SiO_2$, i.e., an oxide, or preferably a low-k dielectric. Alternatively, instead of using conventional nitrides or carbides, barrier layer 210 may be formed by the Ca ion implantation technique of the present invention as further described below and illustrated in FIGS. 2H–2I.

Next, as further illustrated in FIG. 2A, a dielectric layer 212, preferably a low-k dielectric layer, is formed over the dielectric stack (204, 205, 210) as shown in FIG. 2A. Although the dielectric layer will be described further in the sequence of steps as a low-k dielectric layer, the invention is not so limited. That is, the scope of the invention is intended to extend to all dielectric layers, including without limitation $SiO_2$ layers. The same broad interpretation of the potential dielectric layers also applies to dielectric layer 216, discussed further below. The low-k dielectric layer 212 may be formed by various methods known to those of skill in the art, including a PECVD process, a spin-on process, and a flow-fill process. The low-k dielectric layer may be SiCOH or some other dielectric composition formed using silicon, carbon, oxygen and hydrogen, such as are known in the art. Low-k materials exhibit increased porosity in comparison to conventional silicon oxide dielectric layers. Such low-k dielectric materials may exhibit k values of 2.8 or lower (compared to conventional dielectrics (e.g. $SiO_2$) which exhibit k values of about 4.0 or more). For example, low-k organosilicate films have shown k values ranging from 2.6 to 2.8. Low-k dielectrics are well known in the art and are discussed, for example, in "Designing Porous Low-k Dielectrics," Semiconductor International (May 2001), incorporated by reference herein in its entity.

Figure 2B:
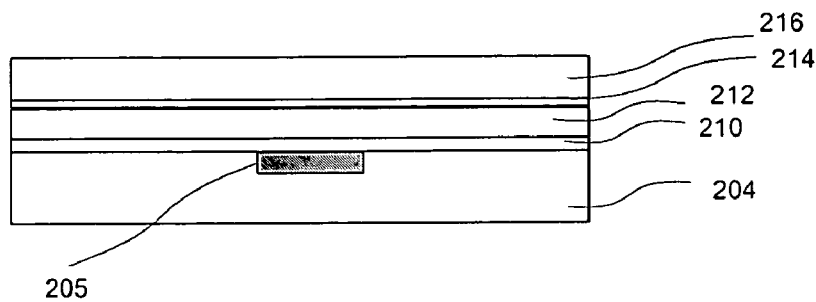

According to conventional steps, an etch stop layer 214 is then optionally deposited on top of the low-k dielectric layer 212 as shown in FIG. 2B. The etch stop layer 214 is selective to the low-k dielectric material deposited in the overlying layer. SiC materials are commonly used as etch stops. Alternatively, trenches and vias may be etched into a single dielectric layer, the bottom of the trench determined by a timed etch or other method in lieu of etch stop layer 214. As also shown in FIG. 2B, a second low-k dielectric layer 216 is then deposited on top of the etch stop 214 to facilitate fabrication of the dual damascene structure. A capping layer 218 is then deposited over the second low-k layer 216, for protecting the fragile low-k layer during chemical mechanical polishing (CMP). This capping layer 218 will be then removed during Cu CMP process, and therefore has no impact on the final film stack. For example, SiON, or SiOC may be used for the capping layer.

Figure 2C:
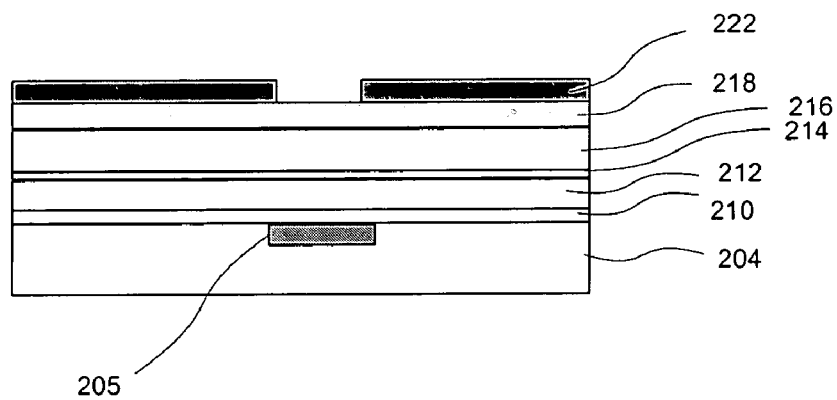
Figure 2D:
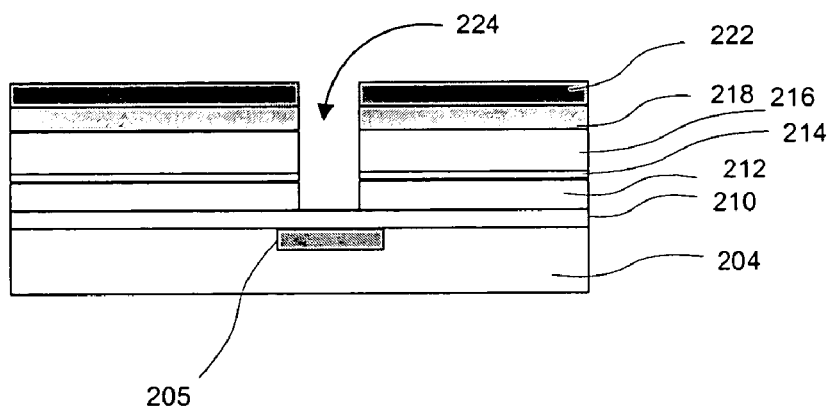
Figure 2E:
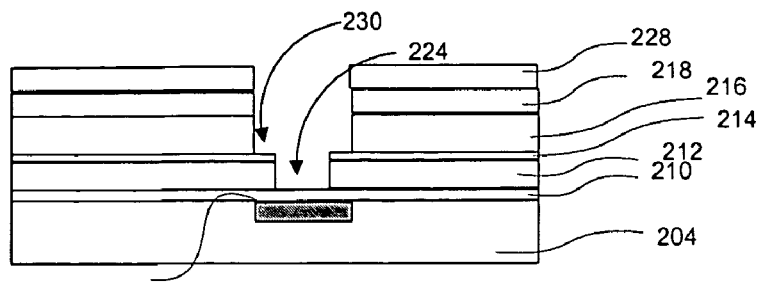

As shown in FIG. 2C, a photoresist layer is then deposited on the stack, and patterned to form a mask 222. A via 224 is etched through capping layer 218, two low-k dielectric layers 212 and 216 as well as etch stop 214 (See FIG. 2D). This may be achieved through the use of an anisotropic etch such as a plasma dry etch. Following removal of the mask layers, the trench is formed as summarized below. That is, after removal of the first photoresist layer, a second photoresist layer 228 is deposited, patterned and etched to form the trench 230 as shown in FIG. 2E. Etching stops on the etch stop layer 214 to form the trench and via structure shown in FIG. 2E. Once the trench (in a single damascene structure) or the trench and via (in a dual damascene structure) is defined, creation of the sidewall barrier layers in accordance with the present invention proceeds.

Figure 2F:
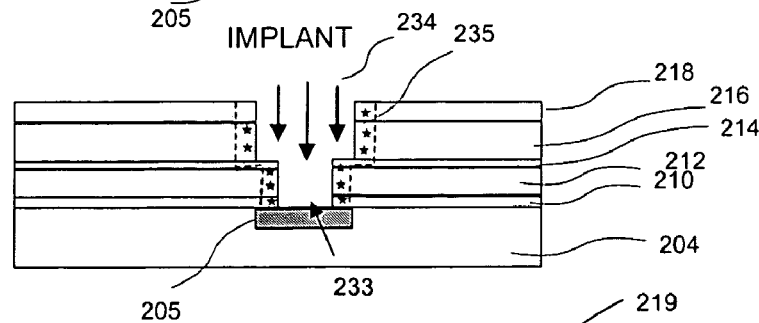

As illustrated in FIG. 2F, a calcium implant 234 is performed to form the barrier layer in one embodiment of the present invention. In a preferred embodiment, the calcium ions are implanted into the sidewalls using a combination of tilted and non-tilted calcium ion implantation steps. Preferably, the implantation is a 4-way rotation implantation. The 4-way rotation implantation consists of four discrete implantations with twist angle increments of 90 degrees per implantation and with 25% of the calcium implanted in the trench sidewalls for a given twist angle. For 4-way rotation implantation the wafer tilt angle is, generally, kept at a fixed value.

Tilted implantation incorporates calcium atoms into sidewalls. The bottom of the trench is preferably implanted using a non-tilt (or tilt=0 degrees) wafer setup, as shown in FIG. 2F. That is, the implant is directed at a 90° angle relative to the substrate. Preferably, the implantation energy lies in the range from about 1 to 80 keV, more preferably from 10 to 20 keV. Preferred ion doses lie in the range from $1 \times 10^{14}$ cm$^{-2}$ to $1 \times 10^{16}$ cm$^{-2}$. Preferably, the tilted implant of the ion species is conducted at a tilt angle ranging from about 0 to 30° (relative to a line perpendicular to the bottom of the trench), more preferably about 7°. Using these implantation conditions, a thin calcium doped dielectric layer 235 may be formed on the sidewalls of the trench. Preferably, the implant energy and tilted implant are controlled to provide a peak concentration of Ca atoms at a depth of about 50 to 500 Angstroms from the exposed surface of the trench sidewall, i.e., the surface that in the final configuration lies adjacent to the copper interconnect.

In another embodiment a tilted multi-step calcium ion implantation is used. The maximum tilt angle is determined by the geometric shape of the trench. The angle should be selected so that sufficient levels of calcium atoms are incorporated beneath the surfaces of the trench sidewalls. The number of rotations (or number of twist angles with fixed angular increments) during this implant is determined by the layout of the different trenches on the chip and may vary, but 4 rotations are preferred to produce symmetric calcium profiles in the trenches. For sidewall doping, the implant conditions preferably include 4 rotations at about 7° tilt and the Ca ion dose ranging from $1 \times 10^{14}$ cm$^{-2}$ to $1 \times 10^{16}$ cm$^{-2}$.

In other embodiments, the calcium ion implantation is conducted as a straight implant or/and at an angle other than 0 to 30 degrees. The projected ranges of the implanted calcium atoms should not exceed a desired doped layer thickness sufficient to retard thermal diffusion of Cu into the dielectric.

In a preferred embodiment, as much of the implanted calcium as possible is concentrated at the surface layer of the sidewalls of the trench. The conditions for such a calcium implantation may be readily determined either by using simulation code or/and routine calibration implantations, i.e. with little experimentation at the time of implantation. That is, the layer thickness of the Ca implanted region may be adjusted in accordance with the energy of the Ca implants.

In subsequent steps, the photoresist mask 228 is removed according to conventional steps as well as the exposed barrier layer 210 (open barrier etch) adjacent to the metal layer 205. Etch gases for performing an open barrier etch are well known to those of skill in the relevant art and will not be described further here. These are typically low energy etches, for example, using gas mixtures containing $CF_4$ or similar. See FIG. 2F.

Moreover, as illustrated in FIG. 2F, in another embodiment a calcium implant 234 is angularly directed to form a barrier layer 235 on the trench sidewalls. In one embodiment, the calcium ions are implanted into the sidewalls using tilted calcium ion implantation, or alternatively a combination of tilted and non-tilted calcium ion implantation. As described previously, the implantation can be a 4-way rotation implantation. Also as previously described, the tilted implantation incorporates calcium atoms into sidewalls. Also, the bottom of the trench can be implanted using a non-tilt (0 degree tilt) wafer setup, such as shown in FIG. 2F. Implantation energies can range from about 1 to 80 keV, more specifically from 10 to 20 keV. Ion doses can range from about $1 \times 10^{14}$ cm$^{-2}$ to $1 \times 10^{16}$ cm$^{-2}$. The tilted implant 234 is generally conducted at a tilt angle ranging from about 0 to 30° (relative to a line perpendicular to the bottom of the trench), in one example implementation about 7°. Under such conditions, a thin calcium doped dielectric layer 235 may be formed on the sidewalls of the trench. It is desirable to provide a peak concentration of Ca atoms at a depth of about 50 to 500 Angstroms from the exposed surface of the trench sidewall, i.e., the surface that in the final configuration lies adjacent to the copper interconnect. It should be noted that the maximum tilt angle is determined by the geometric shape of the trench. The angle should be selected so that sufficient levels of calcium atoms are incorporated beneath the surfaces of the trench sidewalls. The number of rotations (or number of twist angles with fixed angular increments) during this implant is determined by the layout of the different trenches on the chip and may vary, but 4 rotations can be used to produce symmetric calcium profiles in the trenches. For example, sidewalls can be doped, using 4 rotations at about 70° tilt with a Ca ion dose ranging from about $1 \times 10^{14}$ cm$^{-2}$ to $1 \times 10^{16}$ cm$^{-2}$.

Figure 2G:
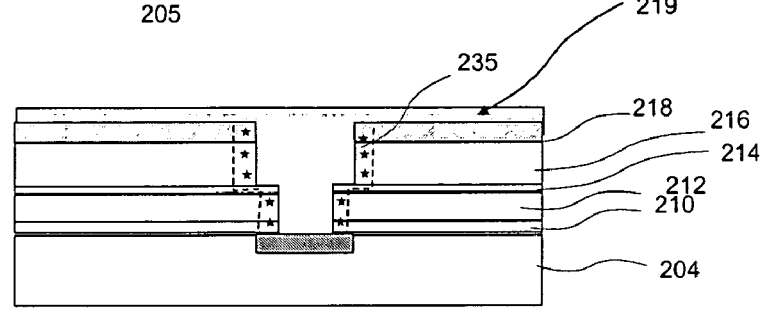
Figure 2H:
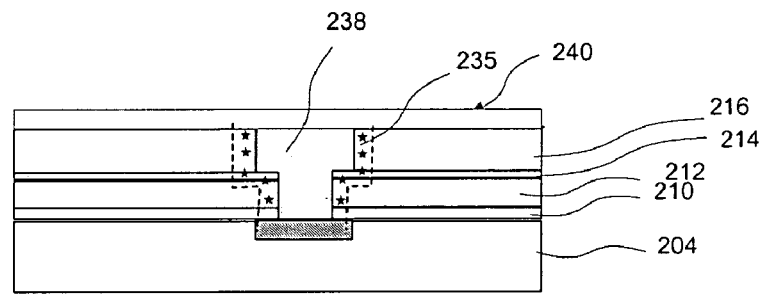
Figure 2I:
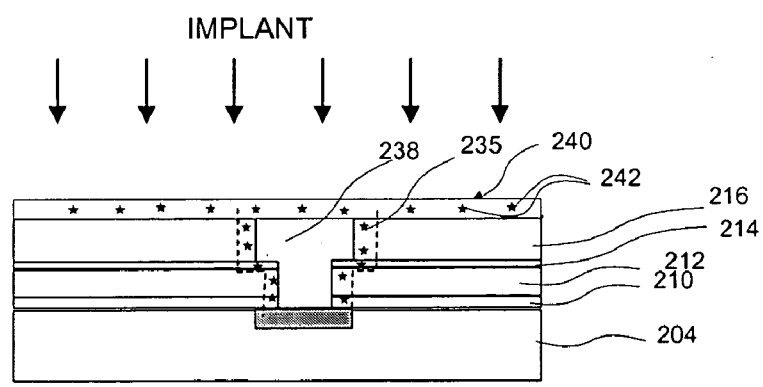

Next, as illustrated in FIG. 2I and according to standard processing techniques, the via and trench will typically then be filled first with a copper seed layer (not shown) either by PVD, iPVD, SIPVD, MOCVD, electroless, ALD or direct plating methods.

Next, the trench and via are filled by electroplating copper or other conventional methods, as illustrated in FIG. 2G, to form copper interconnect bulk layer 219. FIG. 2H illustrates the interconnect structure following chemical mechanical polishing (CMP). That is, the deposited bulk copper 219 and the capping layer 218 are polished to form a planarized surface 219 on both the copper interconnect 238 and the adjacent surface of the dielectric 216. The removal of the capping layer 218 is effectuated by the polishing.

A thin oxide layer 240 is then formed over the copper interconnect 238. The description of the layer as an oxide layer is intended to be illustrative and not limiting. That is, any suitable dielectric layer with suitable properties including k values and suitability for incorporation into the damascene processing steps may be formed. For example, the oxide layer preferably comprises a low-k layer. By using a low-k layer, the overall dielectric constant value of the copper damascene structure is reduced.

Next, as illustrated in FIG. 2I, the thin oxide layer is implanted with a Calcium dopant 242. Preferably, the thin oxide layer 240 has a thickness in the range from 0 to 500 Angstroms, and comprises any low-k dielectric. The conditions for implantation into this barrier/etch stop layer formed at the top of the interconnect are similar to those described above for the implant into the trench sidewalls except for the angle of tilt. That is, a straight tilt angle for the implant is preferred, although the angled implants in the ranges described above are also expected to be suitable. Thus, the thin barrier/etch stop positioned on top of the formed interconnect is preferably formed using an implantation energy in the range from about 1 to 80 keV, more preferably from 10 to 20 keV. A preferred ion dosage lies in the range from $1 \times 10^{14}$ cm$^{-2}$ to $1 \times 10^{16}$ cm$^{-2}$.

If the thin silicon oxide layer is 350 Å thick, an implantation of calcium ions at a dose of $2 \times 10^{15}$ Ca/cm$^2$ and an energy of 10 keV would cause almost 50% of the entire layer to become a barrier layer. If the silicon oxide layer is 600 Å thick, an implantation of calcium at a concentration of $4\times10^{15}$ Ca/cm$^2$ at an energy of 20 keV would cause almost 50% of the entire layer to become a barrier layer. According to this embodiment, the conventional barrier/etch stop layer formed from carbides or nitrides is replaced with dielectric materials having a lower dielectric constant.

According to an alternative embodiment, the calcium ions are implanted directly into the planarized surface of the Cu interconnect 234. This eliminates a step, i.e., the deposition of the thin low-k layer to form the barrier.

Figure 2J:
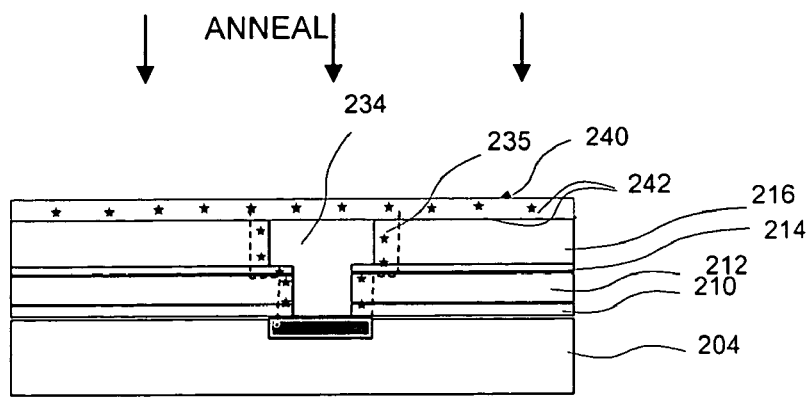

The barrier layers may then be annealed as illustrated in FIG. 2J. The entire semiconductor device may be heated to a temperature of about 600° C. to provide annealing, which facilitates optimal calcium incorporation into the silicon oxide and lateral re-distribution of the dopant in forming the barrier layer. The above doping concentrations provide the desired dopant-to-silicon-oxide ratio.

Figure 2K:
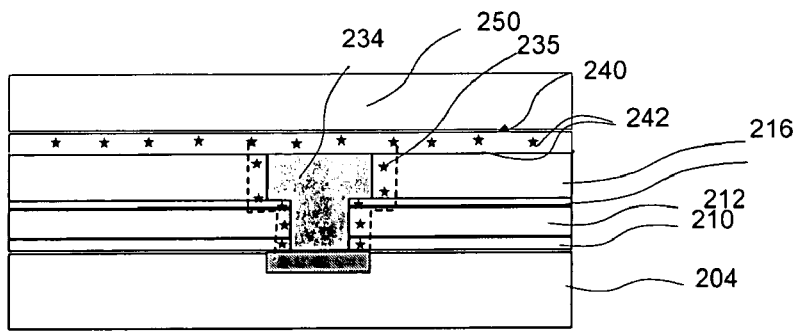

An additional dielectric layer 250, as illustrated in FIG. 2K, may then be placed over this top barrier layer 240, for example, for the formation of additional interconnects, contact pads, or merely for passivation purposes. The dielectric forming the dielectric layer 250 may comprise silicon oxide, a low-k dielectric, or any other suitable dielectric.

An alternative method of forming the barrier layers includes exposing the silicon oxide layers to plasmas of the dopant ion. A calcium ion plasma would provide a lower energy Ca implantation with a higher flux. The lower energy may provide a thinner barrier layer.

As shown, implanting Ca ions into the dielectric provides a new method to remove or to reduce the amount of barrier layer. Quantum calculations show that 2% Ca atoms in oxide form an attraction to neutral Cu as high as 5 eV, thus providing an effective barrier to Cu diffusion into the oxide or other dielectric. With minimal experimentation, an optimal level of Ca concentration can be determined for the particular Cu interconnect technology nodes desired. The thickness of the Ca-implanted layer can be adjusted by varying the energy of Ca ions.

Although the embodiments of the invention have been illustrated and described relative to a dual-damascene process, the invention is not so limited. The scope of the invention is intended to extend to all damascene processes including single damascene and to include the various methods of forming a dulia damascene interconnect. For example, other methods of forming interconnects include trench first and buried via processes. All such variations are within the scope of the present invention.

With the techniques of the present invention, a thin doped dielectric layer copper-diffusion resistant film may be created. By forming a thin Ca doped film, the cross-section of the interconnect may be increased and thus the resistivity decreased while still effectively preventing the diffusion of Cu from the interconnects to the dielectric layers. Further, forming a barrier/etch stop film using Ca doping at the via bottom or the top of the interconnect reduces the overall dielectric constant in the copper damascene structure. That is, by implanting Ca ions directly into a low-k layer or a thin oxide layer, the dielectric constant of the barrier/etch stop layer is minimized and hence the effect of the barrier layer on the overall copper damascene structure is also minimized. Finally, the implantation of the Ca ions into the dielectric helps overcome the weak adhesion between copper and oxide dielectrics and thereby prevents peeling (i.e., delamination) of the copper interconnect from the dielectric.

EXPERIMENTAL RESULTS

Figure 3:
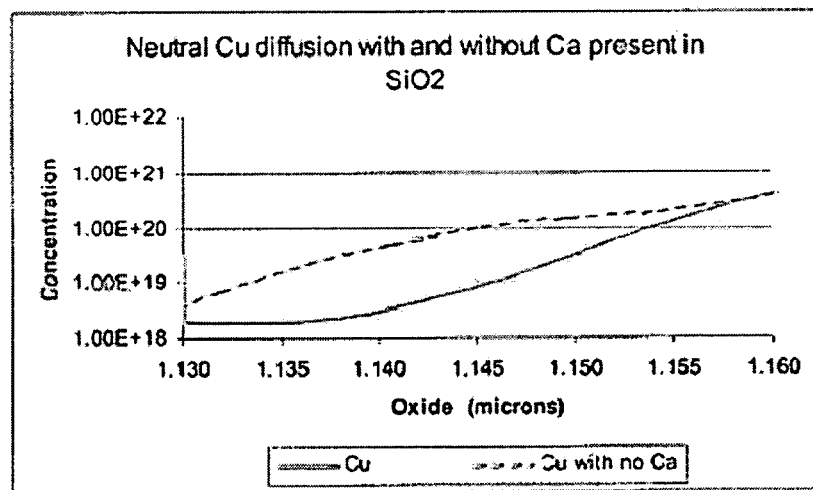
FIG. 3 is a graph comparing the concentrations of Cu into a dielectric in the absence and presence of a Ca barrier, in accordance with one embodiment of the present invention.

Experimental results, as illustrated in FIG. 3, show that incorporation of the Ca into the dielectric reduces Cu diffusion. The experiment involved depositing 100 to 200 mn of low temperature SiO$_2$ on a wafer followed by a high dose calcium ion implantation, i.e., $4\times10^{15}$ Ca/cm$^2$ at 20 keV, into a portion of the wafer. The wafer was then subjected to an 800° C., 10 second Rapid Thermal Anneal (RTA) to minimize any residual damage. A copper film was then deposited over the entire surface. The final step was a 450° C., 4-hour furnace anneal. The Cu concentration in the oxide with implanted Ca (solid line) and oxide without Ca (broken line) are compared. Cu concentration in the oxide with Ca is reduced sharply compared to Cu concentration in the oxide without Ca.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a damascene interconnect barrier layer, the method comprising:
    forming a trench in a dielectric layer;
    implanting Ca ions into the sidewalls of the trench;
    forming a seed layer over implanted sidewalls in the trench; and
    forming an inlaid metal conductor on the seed layer in the trench.

2. The method as recited in claim 1 wherein the Ca ion implantation is conducted using a series of tilted implants.

3. The method as recited in claim 2 wherein the series of tilted calcium ion implantations is conducted at a wafer tilt angle ranging from about 0 to 30° and twist angle increments of 90° per rotation.

4. The method as recited in claim 1 wherein the calcium ion implantation generates a calcium concentration profile extending from the surface of the trench sidewall to a depth up to 500 Angstroms.

5. The method as recited in claim 1 wherein the calcium ion implantation generates a peak calcium concentration to a depth in the range from about 50 to 500 Angstroms from the surface of the trench sidewall.

6. The method as recited in claim 2 wherein the series of tilted calcium ion implants is conducted such that about 25% of calcium is implanted in said trench sidewalls for a given twist angle.

7. The method as recited in claim 2 wherein the series of tilted calcium ion implantation steps are conducted at about a 90° angle to the surface of the substrate.

8. The method as recited in claim 1 further comprising implanting a concentration of calcium ions into the bottom of the channel using a straight implant.

9. The method as recited in claim 1 further comprising forming a second calcium ion implanted layer above the top surface of the inlaid metal conductor wherein said second calcium ion implantation is conducted with Ca ions using 10 to 80 keV energy.

10. The method as recited in claim 9 wherein said second calcium ion implantation is conducted with Ca ions using from 10 to 20 keV of the ion energy (or acceleration energy) and a 0 to 30° tilt.

11. The method as recited in claim 9 wherein said second calcium ion implantation is conducted with a $1 \times 10^{14}$ cm$^{-2}$ to $1 \times 10^{16}$ cm$^{-2}$ of ion dose.

12. The method as recited in claim 9 wherein said second calcium ion implantation is formed in a low-k layer disposed directly on the top surface of the inlaid conductor.

13. The method as recited in claim 12 wherein the low-k layer has a thickness in the range from about 10 to 500 Angstroms.

14. The method as recited in claim 9 wherein the inlaid conductor is copper and said second calcium ion implantation is formed directly on the top surface of the inlaid conductor.

15. The method as recited in claim 1 wherein the trench is formed in a single damascene process.

16. The method as recited in claim 1 wherein the trench is formed in a dual damascene process.

17. A semiconductor integrated circuit comprising:

a dielectric layer having a channel formed therein;

a seed layer formed in the channel;

an inlaid copper conductor formed on the seed layer in the channel of the dielectric layer;

a first calcium implant region comprising a concentration of Ca atoms incorporated into the sidewalls of the channel under the seed layer using ion implantation; and a second calcium ion implanted region formed in a low-k layer disposed directly on the top surface of the inlaid conductor.

* * * * *